United States Patent [19]

Katz

[11] Patent Number: 4,755,769
[45] Date of Patent: Jul. 5, 1988

[54] COMPOSITE AMPLIFIER WITH EFFICIENT POWER REDUCTION

[75] Inventor: Allen Katz, Trenton, N.J.

[73] Assignee: General Electric Company, East Windsor, N.J.

[21] Appl. No.: 52,104

[22] Filed: May 20, 1987

[51] Int. Cl.[4] ............................................. H03F 3/08
[52] U.S. Cl. ........................................ 330/295; 330/51; 330/124 R
[58] Field of Search ................ 330/124, 124 D, 51, 330/53, 295; 333/101–108

[56] References Cited

U.S. PATENT DOCUMENTS

| | | | |
|---|---|---|---|
| 4,311,965 | 1/1982 | Jones | 330/124 R |
| 4,315,222 | 2/1983 | Saleh | 330/124 D |
| 4,626,806 | 12/1986 | Rosar et al. | 333/104 |
| 4,641,106 | 2/1987 | Belohoubek et al. | 330/286 |
| 4,697,160 | 9/1987 | Clark | 333/103 |

Primary Examiner—James B. Mullins
Attorney, Agent, or Firm—Clement A. Berard, Jr.; William H. Meise

[57] ABSTRACT

A composite amplifier includes a plurality of signal amplifiers. The amplified signals are coupled by transmission lines to node points for combination. In order to achieve a reduction in power below full output power, some of the amplifiers are deenergized. Shorting switches at selected points along the transmission lines are selectively rendered conductive to adjust the impedances to maintain impedance match. Short- or open-circuited transmission lines may also be switched in-circuit to aid in maintaining impedance match.

16 Claims, 6 Drawing Sheets

COMPOSITE AMPLIFIER WITH EFFICIENT POWER REDUCTION

This invention relates to composite power amplifiers in which the output powers from a plurality of separate amplifiers or amplifier modules are combined to produce a higher power output signal.

Many communication systems require transponders separated by significant distances. Such transponders when used for radiative communication links between cities eliminate the need for land communication cables, which are very costly. The transponders cannot always be placed in the most ideal location, but rather must be placed at locations where towers can be placed, and the antennas may be required to have relatively high gain. The necessary gain is achievable with antennas of reasonable size and reasonable cost only at microwave frequencies and at frequencies higher than microwave.

The transmission of signal from one transponder to another transponder requires a power amplifier located at the transponder which is capable of generating many watts of power with great reliability. In the past, the microwave power was generated by traveling wave tubes (TWT). Taveling wave tubes were, and continue to be, used for microwave transponders notwithstanding the reliability problem attributable to the inherent degradation resulting from operation over a period of time. More recently, solid state power amplifiers (SSPA) have been used at lower microwave frequencies, such as at C-band, instead of traveling wave tubes. The SSPA has no inherent degradation mechanism, and therefore is more reliable than the TWT. This reliablity is very advantageous, since microwave transponders are often placed at relatively inacessible locations, as for example the top of mountains. Generally speaking, solid state power amplifiers are implented by using a relatively large number of relatively low power solid state devices or amplifier modules. Each solid state device provides a small portion of the total power output, and power combiners are used to combine the powers from each of the individual solid state devices to generate the desired amount of signal power at the desired microwave or millimeter wave frequencies.

For some purposes, it may be desirable to be able to vary the output power of the solid state power amplifier. This might be desirable to overcome the effects of increased or decreased path attenuation due to rainfall, foliage or other effects. Since some microwave transponders are located in areas far from a power grid, and therefore rely upon solar energy to generate energization voltages, it is important that control of the output power be performed in an efficient manner. Generally speaking, it is not efficient to simply reduce the amount of signal being amplified by an SSPA, as this reduces the amount of output power without affecting the energization power.

Various types of power combiners are described in the article "Microwave Power Combining Techniques," by Kenneth J. Russell, published in the *IEEE Transactions on Microwave Theory and Techniques*, May 1979. The Russell article describes corporate or tree combiners, in which chains of combination are performed. Such arrangements tend to be disadvantageous because of the accumulation of losses in the combiners. It is extremely desirable that the power combination be performed with low loss. U.S. Pat. No. 4,641,106 issued Feb. 3, 1987, to Belohoubek et al. describes a low-loss radial power combiner. The radial power combiner is very advantageous when a large number of individual solid state amplifiers have their outputs combined. If one of the amplifiers fails, the net effect on the overall operation is small. However, if a large proportion of the amplifiers should fail, there might be significant degradation of the impedance match and combiner loss, and therefore there might also be a degradation in the amplifier gain. The degradation of impedance match and amplifier gain would also occur if some of the amplifier modules were to be deenergized in order to operate at reduced power levels.

When a relatively small number of solid state power amplifier modules are to be have their output powers combined to produce a combined output, a low-loss combiner may be disadvantageous, because failure of a single solid state amplifier module may constitute a failure of a significant proportion of the total number of amplifier modules, and consequently, may result in degradation of the performance. Consequently, different considerations may govern power amplifiers which produce a sum output signal by combination of power when relatively few amplifier outputs are combined, compared with the situation which exists when relatively large numbers of amplifiers are combined, as in the Belohoubek et al. patent.

U.S. Pat. No. 4,315,222, issued Feb. 9, 1982, to Saleh describes a power combiner arrangement in which the output power from a plurality of amplifier modules is combined at a single junction. Each amplifier module is coupled to the junction by a transmission line having an electrical length of one-quarter wavelength ($\lambda/4$) at a frequency within the operating frequency range. A sensing arrangement is coupled to each amplifier module which, in the event of failure of an amplifier, decouples the failed amplifier from the combining junction by way of a switch which effectively decouples the amplifier and its associated transmission line from the juncture. In one embodiment of the Saleh arrangement, a short-circuiting switch located at the amplifier output is closed or rendered conductive in order to reflect or present an open circuit to the combining point. The arrangement of the Saleh patent has the disadvantages that failure of an amplifier and the operation of the switch which decouples it from the combining junction results in a change in the impedance at the junction, and also that the source impedance of the combined output is low and depends upon the number of amplifiers which, at the moment, happen to be in operation, and therefore ordinarily requires an impedance transformer. Further, the Saleh arrangement is not amenable to efficient power reduction.

A power amplifier of the combining type is desired in which the combining is performed in a low-loss manner, which is reliable, and which is capable of efficient power reduction.

SUMMARY OF THE INVENTION

A composite amplifier according to the invention includes a power divider or splitter adapted to be coupled to a source of signal for dividing the signal into equal portions. First, second, third, and fourth amplifiers have their inputs coupled to the power splitter for receiving one of the equal signal portions and for amplifying the equal signal portions for producing first, second, third, and fourth amplified signals at first, second, third, and fourth output ports. The first and second output ports are coupled to a first node point by first and second transmission line arrangements having a characteristic impedance equal to a selected impedance. Thus, the impedance at the first node point is half the selected impedance when both amplifiers are operating. The third and fourth output ports are coupled to a second node point by third and fourth transmission line arrangements also having the selected characteristic impedance. Thus, the second node point has an impedance equal to one half the selected characteristic impedance when the third and fourth amplifiers are operating.

Fifth and sixth transmission line arrangements couple the first and second nodes, respectively, to a sum port. The fifth and sixth transmission line arrangements are each one-quarter wavelength long at a frequency within the operating frequency band, and each has the selected characteristic impedance. The fifth and sixth transmission line arrangements perform an impedance transformation between the first and second nodes, respectively, and the sum port, whereby the impedance at the sum port equals the selected impedance when all four amplifiers are operating to produce maximum output power.

A controllable switch arrangement includes a first switch coupled to the second transmission line arrangement for short-circuiting the second transmission line arrangement at a location one-quarter wavelength from the first node point. The controllable switch arrangement includes a second switch coupled to the third transmission line arrangement for short-circuiting the third transmission line arrangement either at the second node point, or in some embodiments at a point one-quarter wavelength from the second node point in either the third (or equivalently at the fourth) transmission line arrangement. When the first and second switches are open, all four amplifiers are energized to produce maximum output power. When the first and second switches are conductive for short-circuiting their associated transmission lines, at least the second and third amplifiers are deenergized, whereby the signal is amplified by the remaining amplifier or amplifiers with high efficiency and full gain.

DESCRIPTION OF THE INVENTION

Figure 1A:
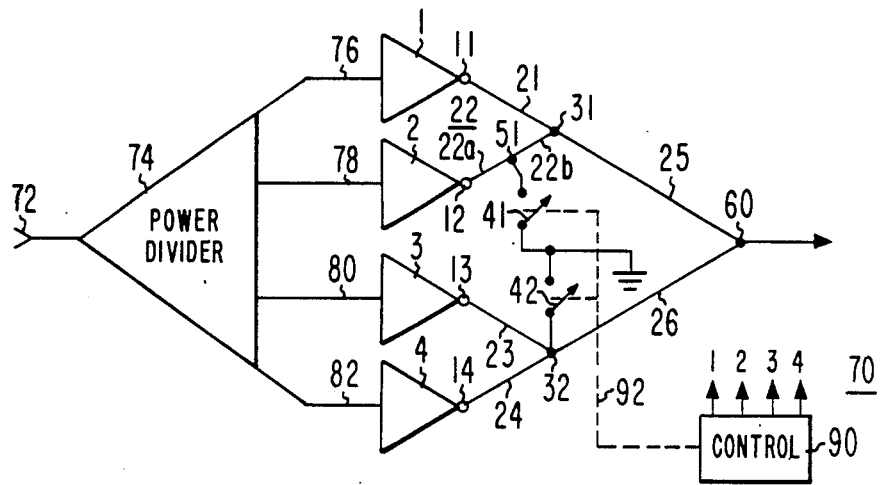
FIGS. 1a, 1b and 1c, referred to jointly as FIG. 1, illustrate in FIG. 1a a simplified block diagram of a composite amplifier according to the invention, in FIG. 1b a redrawing of a portion of the arrangement of FIG. 1a, and in FIG. 1c details of a control circuit for operating at full power and at one quarter power.

FIG. 1a is a simplified block diagram of a composite amplifier 70 including an input port 72 adapted for receiving signal to be amplified and for coupling the signal to a power divider 74. Power divider 74 divides the signal into a plurality of equal portions. As illustrated in FIG. 1a, there are four portions, one of which appears on each of transmission lines 76, 78, 80, and 82 for application to input ports of amplifiers numbered 1, 2, 3, and 4, respectively. Amplifiers 1–4 amplify the applied signal portions and produce amplified signal portions at output ports 11, 12, 13, and 14, respectively.

The amplified signal portion produced at output ports 11–14 are applied through a tree network of transmission lines to a sum output port 60, from which the combined signals are coupled to utilization means (not illustrated). The amplified signal portion produced at output port 11 of amplifier 1 is applied over a transmission line 21 to a first node point 31. The amplified signal portion produced at output terminal 12 of amplifier 2 is applied over portions 22a and 22b of a transmission line 22 to first node point 31. Similarly, the amplified signal portion at output port 13 of amplifier 3 is applied over a transmission line 23 to a second node point 32, and the amplified signal portion produced at output port 14 of amplifier 4 is applied over a transmission line 24 to second node point 32. If the phases of the amplified signals at amplifier output ports 11–14 are equal, and if the path lengths of transmission line pairs 21, 22; 23, 24 are equal, the signal summations at node points 31 and 32 are constructive, and the signal power level at each node point is twice that at either amplifier output port. The sum signals at node 31 are applied over a transmission line 25 to a sum node or point 60, and the sum signals at node point 32 are applied over a transmission line 26 to sum node 60. In the embodiment of FIG. 1a, sum node 60 is the output port. With constructive addition, the power of the signal at sum node 60 is four times the power at the output port of any one of the amplifiers. All the transmission lines illustrated in FIGS. 1a and 1b have a characteristic impedance which equals a selected impedance. The characteristic impedance is often selected to be 50 ohms, but other impedances may be used, such as 75 ohms. The designation $Z_0$ may be used to denote the characteristic impedance of a transmission line.

If it is desired to reduce signal power while maintaining efficiency, it may be desirable to deenergize certain ones of the amplifiers. For example, to achieve quarter-power operation (−6 dB), it may be desirable to maintain amplifier 1 in operation and to deenergize amplifiers 2, 3, and 4. Each of amplifiers 1, 2, 3 and 4 has an output impedance in the energized state which is nominally matched to the impedance of the transmission lines. However, the deenergized amplifiers present impedances at node points 31, 32, and 60 which perturb the operation of the amplifier and which, in general, will result in a power reduction other than that desired. In accordance with an aspect of the invention, a first switch 41 is coupled to transmission line 22 at a node point 51 lying between transmission line portions 22a and 22b for short-circuiting transmission line 22 at node point 51. Similarly, a second switch 42 is coupled to the end of transmission line 23 at node point 32 for short-circuiting transmission line 23 at node point 32. In accordance with a further aspect of the invention, portion 22b of transmission line 22, and transmission line 26, are both selected to have a length which is an odd integer multiple of one-quarter wavelength. More formally, the lengths of transmission line portion 22b and of transmission line 26 are:

$$(2N+1)\lambda/4 \qquad (1)$$

where N is an integer and λ is the wavelength. As illustrated in FIG. 1a, switches 41 and 42 are separated from node points 32 and 51 for simplicity of illustration, but those skilled in the art will understand that switches 41 and 42 are arranged to short-circuit their associated transmission lines without excess line length. As an aside, it is noted that a switch such as switch 41 can short-circuit its associated transmission line when it is conductive, but when nonconductive it does not open-circuit the transmission line.

The operating mode of composite amplifier 70 of FIG. 1a is established by a control circuit 90 which includes conductors coupled to amplifiers 1, 2, 3, and 4 for energization thereof, and also includes control of the position of switches 41 and 42, as illustrated by dashed line 92. Dashed line 92 may represent mechanical control or electrical control of relay windings associated with switch contacts 41 and 42 for remote control thereof, or may represent bias control of solid-state switches, all as known in the art.

Figure 1B:
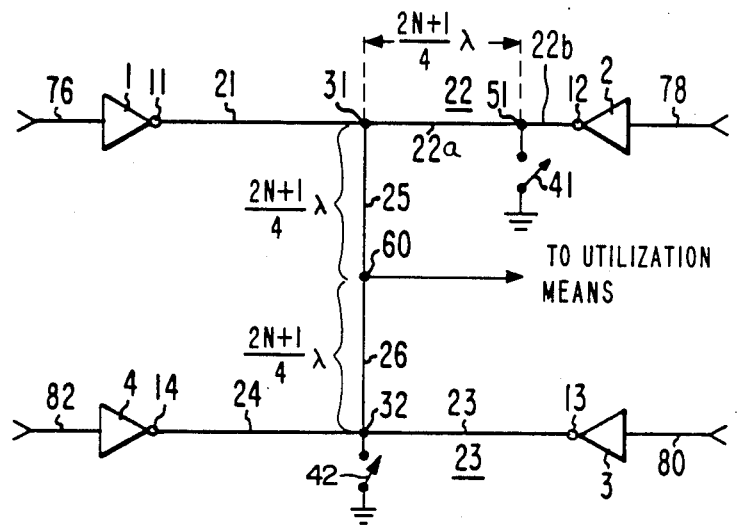

FIG. 1b is a redrawing of portions of composite amplifier 70 of FIG. 1a for convenience in comparing the structure with that of the representations of FIGS. 2-5.

Figure 1C:
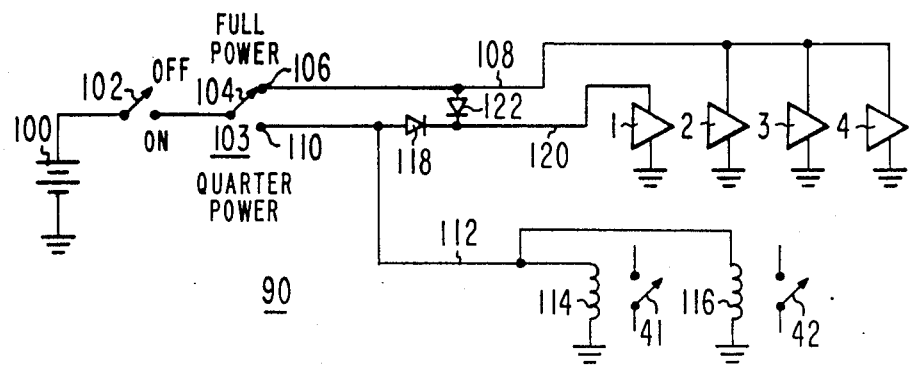

FIG. 1c illustrates details of a possible configuration of control circuit 90 of FIG. 1a. Elements of FIG. 1c illustrates details of a possible designated by the same reference numerals. In FIG. 1c, a power supply illustrated as a battery 100 has its negative terminal grounded and its positive terminal connected through an on-off switch 102 to the common terminal or pole 104 of a single pole, double throw switch 103. The upper switched terminal 106 of switch 103 is connected by a conductor 108 to energize amplifiers 2, 3, and 4. Lower switched terminal 110 of switch 103 is connected by a conductor 112 to relay windings 114 and 116 magnetically coupled to switches 41 and 42, respectively, for control thereof. Lower switched terminal 110 of switch 103 is also connected by the anode-to-cathode path of a diode 118 to a conductor 120 for energizing amplifier 1. A further diode 122 has its anode connected to conductor 108 and its cathode connected to conductor 120.

In operation, control circuit 90 of FIG. 1c enables the composite amplifier of FIG. 1a when ON-OFF switch 102 is closed, which allows energizing voltage to be applied to the common pole 104 of switch 103. When pole 104 is in its upper (FULL POWER) position, supply voltage is applied over conductor 108 to energize amplifiers 2, 3, and 4. Supply power is also applied through the anode-to-cathode path of diode 122 to energize amplifier 1. However, diode 118 is reverse-biased by the supply voltage, and therefore current is not applied to relay windings 114 and 116. Consequently, in the full power operation condition, normally open switches 41 and 42 remain open. The difference in amplifier operating potentials due to diode 122 is assumed to be negligible, but if it is important, other diodes may be used to offset the supply to amplifiers 2, 3 and 4.

In the lower position of switch pole 104 (corresponding to QUARTER-POWER operation), supply voltage is applied by way of terminal 110 and conductor 112 to relay windings 114 and 116, resulting in closure of switches 41 and 42. Supply voltage is also applied by way of the anode-to-cathode path of diode 118 and conductor 120 to energize amplifier 1. Amplifiers 2, 3, and 4 are not energized because diode 122 becomes reverse biased. Thus, in the quarter power position of switch 104, amplifier 1 is energized and switches 41 and 42 are closed. Thus, the signal power is decreased to one-fourth of the full output value, but the energization power is also reduced to one-fourth the maximum value (the power consumed by relay windings 114 and 116 is considered to be negligible).

Referring now to FIG. 1b, with switch 41 closed or conductive in the quarter-power operating mode, transmission line portion 22a is short-circuited one-quarter wavelength from node point 31. As is known to those skilled in the art, transmission line portion 22a presents an impedance to node point 31 which is very high. This is sometimes known as "reflecting" a high impedance to node point 31. Thus, the amplified signal portion produced by amplifier 1 at output port 11 flows by way of transmission line 21 past node point 31 and onto transmission line 25 without signal attenuation attributable to deenergized amplifier 2. In the quarter-power operating mode, switch 42 is also closed or conductive, which short-circuits the ends of transmission line portions 23 and 24 at node point 32, one quarter wavelength from sum node 60. Transmission line portion 26 therefore reflects an open circuit to sum node 60. The high impedance does not perturb the impedance at sum node 60, and therefore the amplified signal portion produced by amplifier 1 flows from transmission line 25 past sum node 60 to the utilization means. In the quarter-power operating mode, amplifier 1 is fully energized, and produces its amplified signal portion at output port 11 with full gain. The signal flows from output port 11 to sum node 60 without significant loss.

Thus, the arrangement of FIG. 1 energizes four amplifiers and sums the amplified signal portions at their outputs in a full power operating mode, and may be switched to a quarter-operating power mode, in which only amplifier 1 is energized, and the signal is coupled from its output port to the composite output port (sum node 60) without significant loss. Full amplifier gain is maintained in either mode. The direct current energization power is reduced by a factor of four in conjunction with the reduction of signal output power, whereby the efficiency remains substantially the same in both operating modes.

Figure 2A:
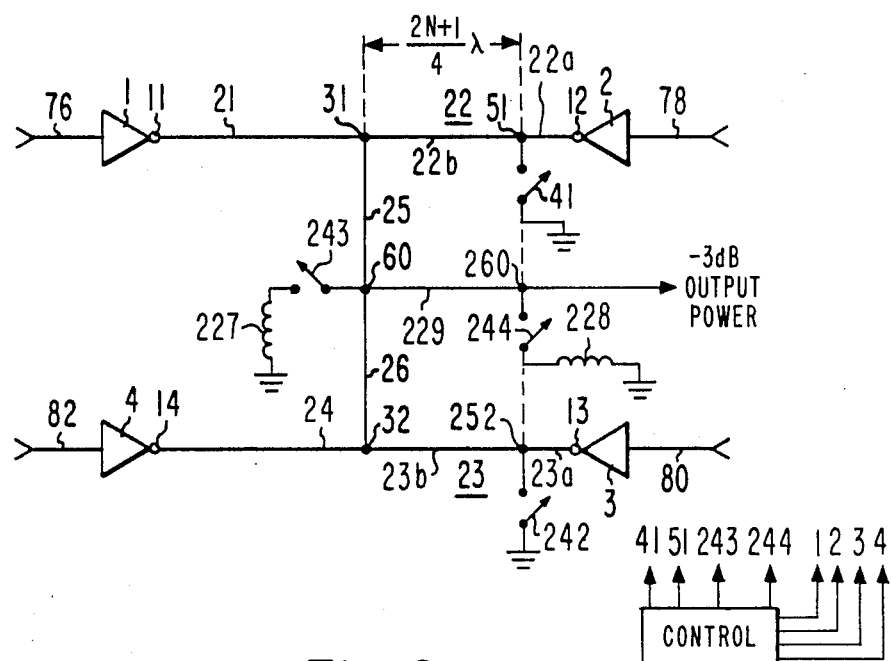
FIGS. 2a and 2b, referred to jointly as FIG. 2, illustrate in FIG. 2a a simplified block diagram of an embodiment of the invention, and in FIG. 2b details of a control circuit therefor for operating at full power and at one half power.

The arrangement of FIG. 2a is similar to that of FIG. 1b. Elements of FIG. 2a corresponding to those of FIG. 1b are designated by the same reference numerals. The arrangement of FIG. 2a differs from that of FIG. 1b in that switch 42 connected to node 32 has been deleted, and a switch 242 has been connected to transmission line 23 at a node point 252, which divides transmission line 23 into portions 23a and 23b. Transmission line portion 23b has a length of one quarter wavelength, in accordance with equation 1. When switches 41 and 242 are closed or conductive, only the amplified signal portions from output ports 11 and 14 of amplifiers 1 and 4 are coupled to sum node 60. Consequently, the arrangement of FIG. 2a is capable of switching between full power operation and half-power (−3 dB) operation. The half-power operation, however, results in a mismatch at sum node 60. This mismatch may be corrected by an arrangement including a further switch 243 serially coupled between sum port 60 and an inductance illustrated as an inductor 227, together with a length of transmission line 229 one-quarter wavelength long, extending from sum node 60 to a further node point 260, and a switch 244 serially connected between node point 260 and an inductance illustrated as an inductor 228. As known in the art, inductors 227 and 228 may be discrete wound inductors, or may be implemented as short-circuited transmission lines. The magnitude of the inductive reactance which must be coupled to sum port 60 by switch 243 in the half-power mode is $Z_0/2$, and the magnitude of the inductive reactance which must be coupled to node point 260 by switch 244 is $Z_0$. As known to those in the art, an impedance of $+JZ_0/2$ may be implemented as a short-circuited S transmission line having a characteristic impedance of $Z_0$ and a length of 0.0735 λ. The impedance of $+JZ_0$ necessary at node point 260 may be achieved by a short-circuited transmission line having a characteristic impedance of $Z_0$ and a length of λ/8. Node 260 is the output port.

Figure 2B:
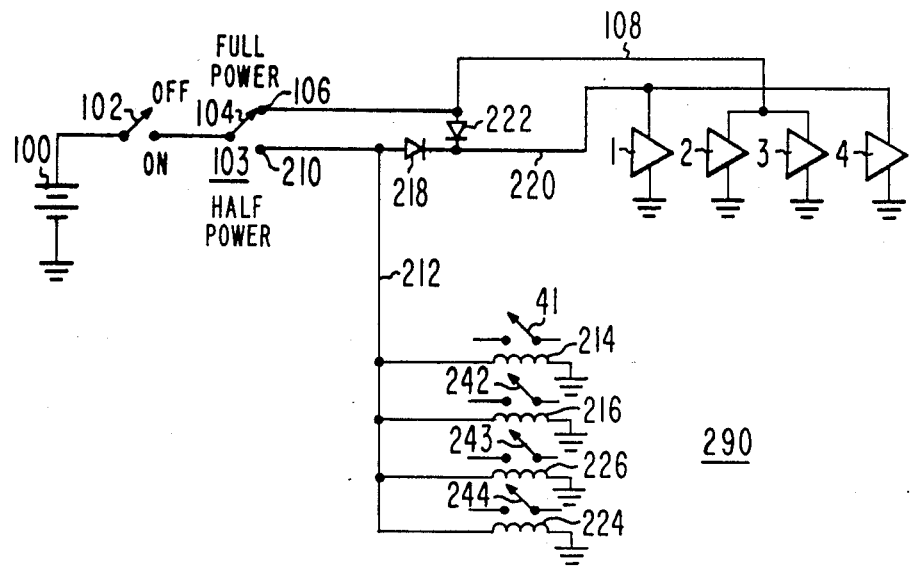

Control circuit 290 of FIG. 2a differs from control circuit 90 in that it controls the arrangement to provide either full-power operation or half-power operation. FIG. 2b illustrates details of control circuit 290. In FIG. 2b, elements corresponding to those of FIG. 1c are designated by the same reference numerals. During full power operation, amplifiers 2 and 3 are energized directly by way of pole 104, terminal 106, and conductor 108. Amplifiers 1 and 4 are energized by way of forward biased diode 122 and conductor 220 from conductor 108. However, during full power operation, back based diode 218 prevents any voltage from appearing on conductor 212, whereby no power is applied to any of relay windings 214, 216, 222, or 224, and therefore normally open switches 41, 242, 243, and 244 remain open. During half-power operation, pole 104 applies power by way of terminal 210 and diode 218 to conductor 220 and amplifiers 1 and 4. Amplifiers 2 and 3 remain deenergized. Also, power is applied by way of terminal 210 to conductor 212, and to windings 214, 216, 222, and 224, thereby closing or rendering switches 41, 242, 243, and 244 conductive, thereby establishing the conditions required for half-power operation in the arrangement of FIG. 2a, together with an impedance match at output port 260.

Figure 3:
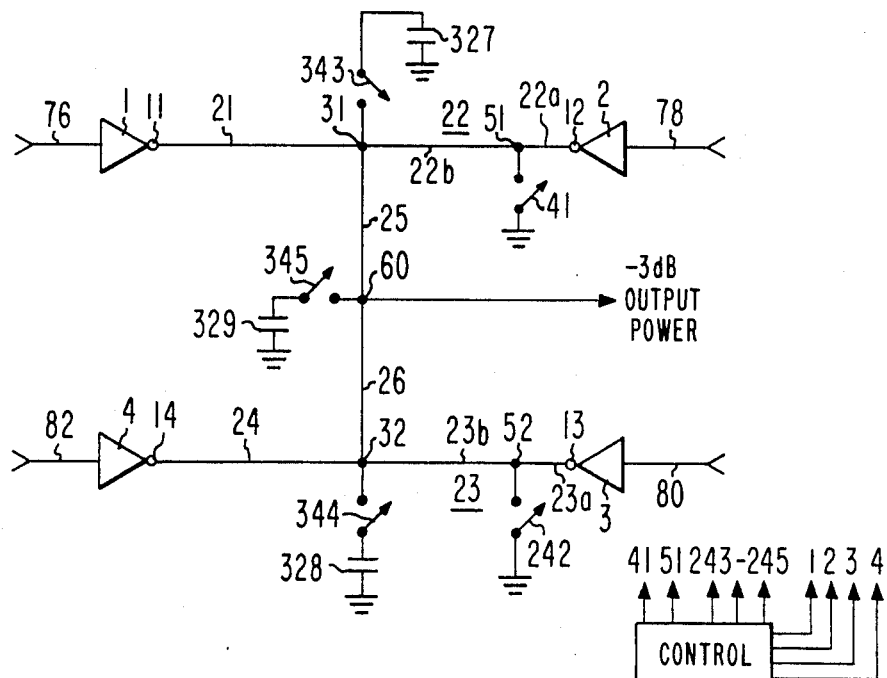
FIG. 3 is a simplified block diagram of another embodiment of the invention in which tuning for the half power case is accomplished by switched capacitances.

FIG. 3 illustrates an arrangement similar to that of FIG. 2a, and elements of FIG. 3 corresponding to those of FIG. 2a are designated by the same reference numerals. FIG. 3 differs from FIG. 2a in that a different impedance matching arrangement is used for matching the output port during half-power operation. As in the arrangement of FIG. 2a, half-power operation is achieved by closing switches 41 and 242. An impedance match at sum port 60 is achieved by use of a series connected switch 343 connected between node point 31 and a capacitance illustrated as a discrete or lumped capacitor 327, by a switch 345 serially connected between sum port 60 and a capacitance illustrated as a discrete capacitor 329, and by a switch 344 serially connected between node 32 and a capacitance illustrated as a discrete capacitor 328. Switches 343, 344, and 345 are closed or conductive during half-power operation to provide an impedance match at sum node 60, which is the output port. The capacitive reactance required at each node is equal to $Z_0$. As known, a capacitive reactance equal to $Z_0$ can be implemented by the use of an open-circuited transmission line having a length of λ/8. Details of control circuit 390 required to achieve either full-power or half-power operation are believed to be self-evident in view of the preceding discussion.

Figure 4A:
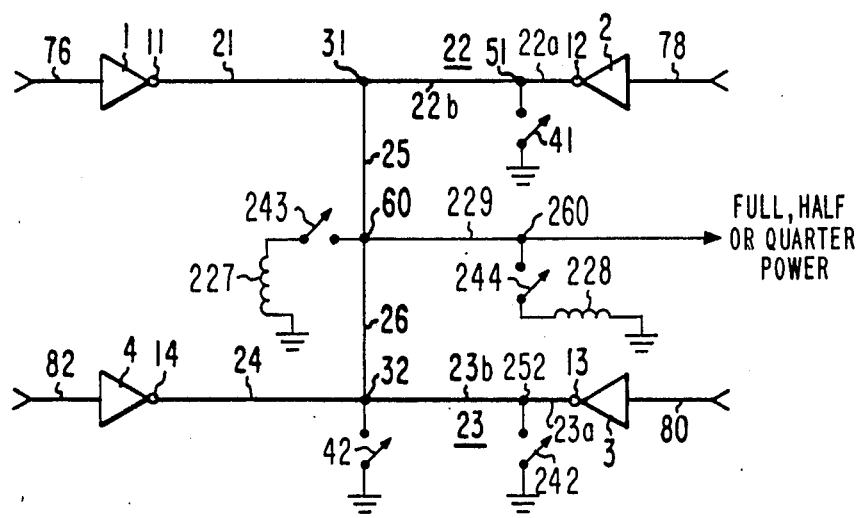
FIGS. 4a and 4b, referred to jointly as FIG. 4, illustrate in FIG. 4a an embodiment of the invention including the functions described in conjunction with FIGS. 1 and 2, and in FIG. 4b a control circuit therefor.
Figure 4B:
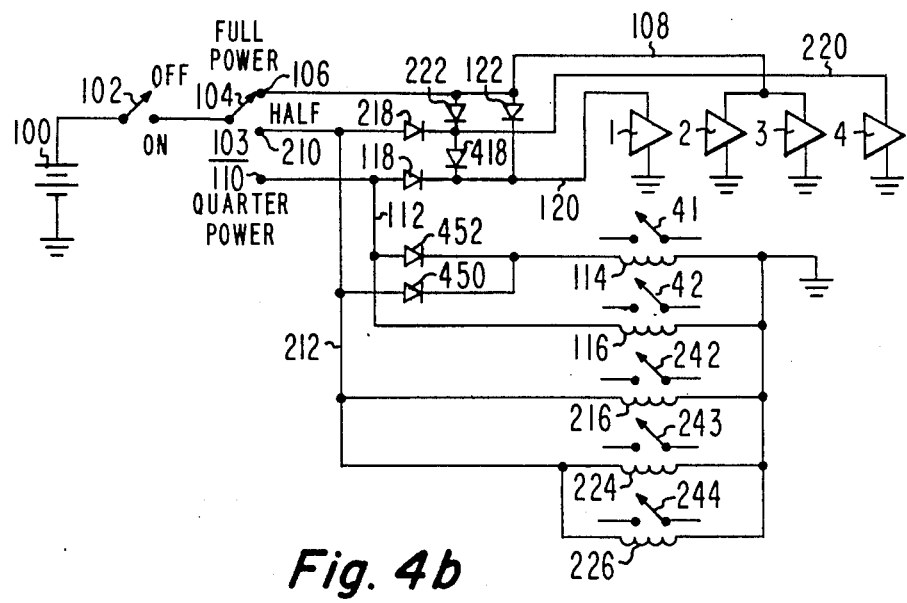

FIG. 4a is a simplified schematic diagram similar to FIGS. 1b and 2a of an arrangement which is adapted for providing full-, half-, or quarter-power operation. In FIG. 4b, elements corresponding to those of FIGS. 1c or 2b are designated by the same reference numerals. The arrangement of FIG. 4a includes switch 42 connected for short circuiting transmission line 23 at node point 32, switch 242 arranged for short circuiting transmission line 23 at node point 252, switch 41 for short circuiting transmission line 22 at node point 51, and switches 243 and 244 coupled to node points 60 and 260, respectively, for coupling matching inductances thereto. FIG. 4b illustrates details of a control circuit adapted for controlling the arrangement of FIG. 4a to full-, half-, or quarter-power modes.

Full power operation is selected in the control circuit of FIG. 4b by connecting pole 104 of switch 103 to full power terminal 106, which couples energizing power to amplifiers 2 and 3 by way of conductor 108, and which also couples power to amplifier 4 by way of diode 222 and conductor 220, and to amplifier 1 by way of diode 122 and conductor 120. Diodes 118 and 218 prevent application of any power to relay windings 114, 116, 216, 224, or 226 during full power operation, therefore all switches (41, 42, 242, 244, and 243) remain open.

For half-power operation, the control circuit of FIG. 4b connects pole 104 of switch 103 to apply power to terminal 210, which forward biases diode 218 to energize amplifier 4 by way of conductor 220, and forward biases a further diode 418 to apply power to amplifier 1 by way of conductor 120. Amplifiers 2 and 3 remain deenergized. Power is also applied during half-power operation from terminal 210 by way of a conductor 212 to relay windings 216, 224, and 226 for closing switches 242, 243, and 244. Power is also applied from terminal 210 of switch 103 by way of conductor 212 and a further diode 450 to winding 114, for closing switch 41, thereby completing the requirements for half-power operation.

Quarter-power operation of the arrangement of FIG. 4a is achieved in the control circuit of FIG. 4b by connecting common pole 104 of switch 103 to terminal 110 of switch 104, which energizes amplifier 1 by the way of diode 118 and conductor 120. Amplifiers 2, 3, and 4 remain deenergized. Power is also applied from terminal 110 directly to relay winding 116 by way of conductor 112 for closing switch 42, and power is also applied to relay winding 114 by way of diode 452 for closing switch 41.

Figure 5:
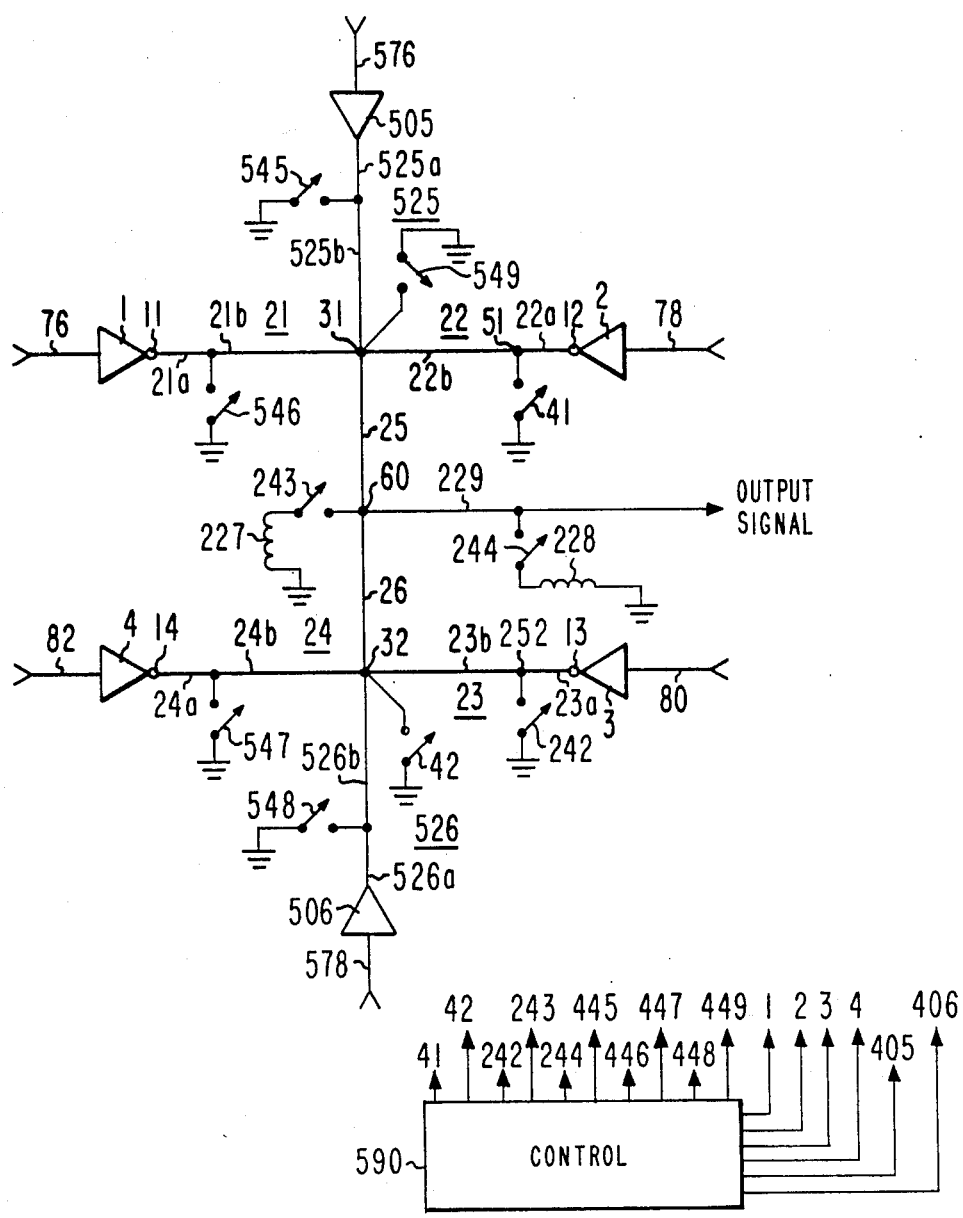
FIG. 5 is a simplified block diagram of an embodiment of the invention including redundant amplifiers for reliability.

FIG. 5 is an extension of the arrangement of FIG. 4a which includes redundant amplifiers 505 and 506 fed from transmission lines 576 and 578, respectively, and which includes further switch contacts 545, 546, 547, 548 and 549 which may be selectively closed under control of a control circuit 590. The signal amplified by amplifier 505 is coupled by way of a transmission line 525 including portions 525a and λ/4 portion 525b to first node point 31. Similarly, a signal produced at the output of amplifier 506 is coupled by way of a transmission line 426 including a portion 526a and λ/4 portion 526b to second node point 32. Node point 31 includes a further grounding switch 549 symmetrical with grounding switch 42 connected to node point 32.

Any one of amplifiers 1, 2, and 505 coupled to node point 31 may serve as a redundant amplifier, and any two of the three may be operated for normal full-power operation. Similarly, any two of amplifiers 3, 4, or 506 may be used as a redundant amplifier, with the other two operating in a full power mode. The operating mode of control circuit 590 will depend upon which amplifiers are available for operation. The operating principles of the arrangement of FIG. 5 will be clear from the preceding discussions.

Figure 6A:
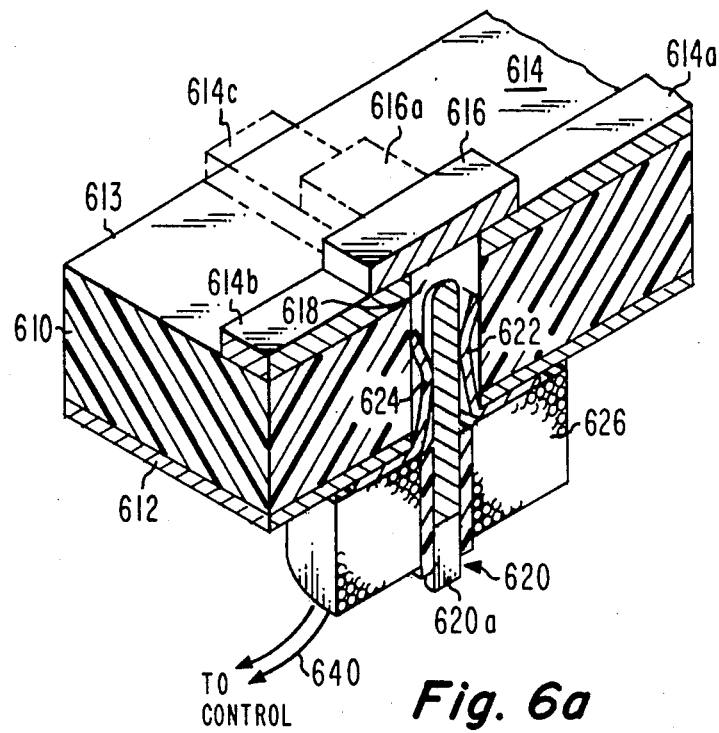
FIGS. 6a and 6b, referred to jointly as FIG. 6, are perspective and cross-sectional views, respectively, of shorting relays usable in conjunction with the arrangements of FIGS. 1–5.
Figure 6B:
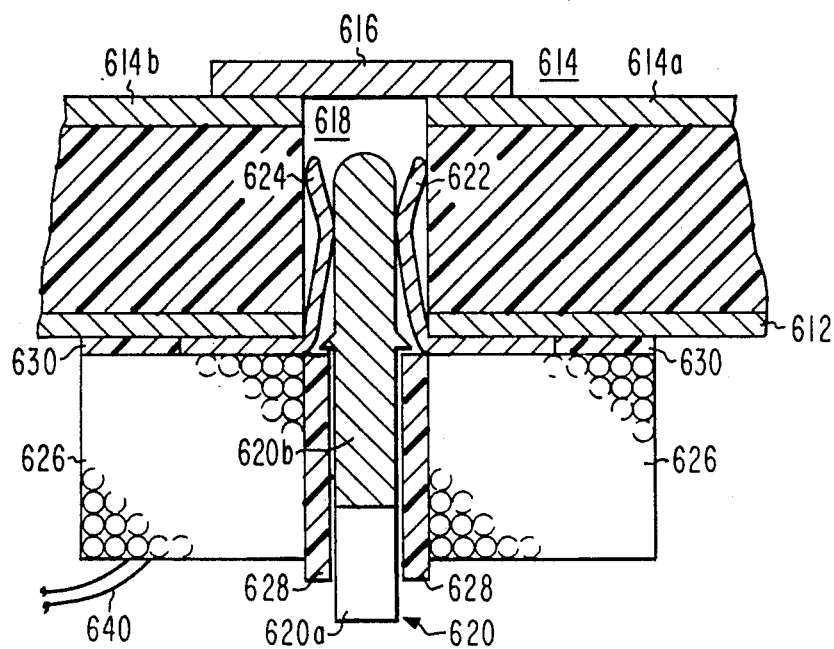

FIG. 6a is a perspective view of a cross-section of a printed circuit board microstrip transmission line illustrating details of a relay-operated grounding switch suitable for operation in conjunction with FIGS. 1–5. In FIG. 6a, a flat dielectric plate 610 has its bottom surface coated with a conductive ground plane 612. Upper surface 613 of dielectric plate 610 supports an elongated strip conductor designated generally as 614, which includes portions 614a and 614b separated by a through hole 618 which extends from the upper surface of strip conductor 614 through dielectric plate 610 and ground plane 612. Strip conductor 614 coats with dielectric plate 610 and ground plane 612 to form a microstrip transmission line, as well known to those skilled in the art. A metallic cap 616 is connected to the upper surface of transmission line 614 in conductive contact with portions 614a and 614b, and bridging hole 618. Cap 616 is dimensioned to resist the forces occasioned by switch actuation. A composite switch plunger 620 is slideably mounted within hole 618 and makes conductive contact along its sides with grounding springs 622 and 624, which in turn make conductive contact with ground plane 612. In addition to providing contact with ground, spring contacts 622 and 624 tend to retain plunger 620 in position. The lowermost portion of composite plunger 620, as illustrated in FIG. 6a, is a magnetic portion 620a. Portion 620a may be made from soft iron, ferrite, or other magnetic material, while the conductive upper portion 620b is made from a nonmagnetic conductive material such as copper. A relay coil 626 consisting of conductive windings surrounds plunger 620 and has leads 640 adapted to be coupled to the control unit of the composite amplifier. FIG. 6b is an elevation view of the near face of the arrangement of FIG. 6a. More clearly visible in FIG. 6b is a dielectric bushing 628 which may be part of a bobbin or form on which windings 626 are wound, and which tends to maintain alignment of plunger 620. Also visible in FIG. 6b is a layer of adhesive material 630 which holds magnetic windings 626 and bushing 628 affixed to the lower surface of ground plane 612.

In operation, current applied to windings 626 tends to attract magnetic portion 620a of plunger 620 upward, thereby driving the entire plunger upward and causing the conductive tip of plunger 620 to contact cap 616. Since cap 616 is in conductive contact with strip conductor 614, and plunger 620 makes conductive contact with ground plane 612 by way of spring clips 622 and 624, a short, low inductance path is thereby formed between strip conductor 614 and ground for effectively grounding the microstrip transmission line at the location of hole 618.

FIG. 6a also illustrates in phantom outline a further elongated conductive element 614c which intersects conductors 614b and 614c at or near through hole 618. When more than two strip conductors intersect at hole 618, the cap is dimensioned to make contact with them, as by extending cap 616 with a further portion 616c, as also outlined in phantom. Thus, the grounding provided by plunger 620 can occur at the intersection of multiple transmission lines.

Other embodiments of the invention will be apparent to those skilled in the art. For example, transmission lines other than microstrip may be used, such as stripline, waveguide or coax. Any type of grounding or connecting switch may be used, either locally or remotely operated, mechanical or solid-state. The amplifiers may be single or multiple-stage, and may include phase trimming elements. The control circuit may be an analog, locally controlled system such as those illustrated in FIGS. 1c, 2b and 4b, or it may be remotely controlled by a telemetry or data link, and/or implemented by digital logic circuits. While switch 242 has been illustrated in FIG. 2a as being connected to transmission line 23, those skilled in the art realize that it could alternatively be connected to transmission line 24, with an appropriate change of the control circuit to deactivate amplifier 4 rather than amplifier 3 when the switch is conductive. While equal power division has been described in conjunction with power divider 74, those skilled in the art will recognize that some inequality is unavoidable.

What is claimed is:

1. A composite amplifier, comprising:
power splitting means adapted to be coupled to a source of signal for dividing the signal into equal portions;
first, second, third and fourth amplifiers, each coupled to said power splitting means for receiving one of said equal portions of signal for producing first, second, third and fourth amplified signals at first, second, third, and fourth output ports, respectively;
a first transmission line arrangement having a characteristic impedance equal to a selected impedance, said first transmission line arrangement being coupled between said first output port and a first node point for coupling said first amplified signal from said first output port to said first node point;
a second transmission line arrangement having said selected characteristic impedance, said second transmission line arrangement being coupled between said second output port and said first node point for coupling said second amplified signal from said second output port to said first node point for summing said first and second amplified signals;
a third transmission line arrangement having said selected characteristic impedance, said third transmission line arrangement being coupled between said third output port and a second node point for coupling said third amplified signal from said third output port to said second node point;
a fourth transmission line arrangement having said selected characteristic impedance, said fourth transmission line arrangement being coupled between said fourth output port and said second node point for coupling said fourth amplified signal from said fourth output port to said second node point for summing said third and fourth amplified signals;
a fifth transmission line arrangement having said selected characteristic impedance and an electrical length which is an odd multiple of one-quarter wavelength at a frequency within the operating frequency band, said fifth transmission line arrangement being coupled between said first node point and a sum node for coupling said summed first and second amplified signals from said first node point to said sum node;

a sixth transmission line arrangement having said selected characteristic impedance and an electrical length which is an odd multiple of one-quarter wavelength at said frequency, said sixth transmission line arrangement being coupled between said second node point and said sum node for coupling said summed third and fourth amplified signals from said second node point to said sum node to be summed with said first and second amplified signals;

controllable switch means, said controllable switch means comprising first switch means coupled to said second transmission line arrangement at a first location which is an odd multiple of one-quarter wavelength at said frequency from said first node point, said first switch means being adapted for controllably short-circuiting said second transmission line arrangement at said first location in a first mode of operation and for not short-circuiting said second transmission line in a second mode of operation, said controllable switch means further comprising a second switch means coupled to said third transmission line arrangement, at least at a second location which is N quarter wavelengths at said frequency from said second node point, where N is an odd integer including zero, said second switch means being adapted for short-circuiting said third transmission line arrangement at said second location in said first mode of operation, and for not short-circuiting said third transmission line arrangements in said second mode of operation; and control means coupled to said controllable switch means for selecting one of said first and second modes of operation, whereby in said second mode of operation said first, second, third, and fourth amplified signals are summed at said sum node, for full-power operation, said impedances at said first and second node points are equal to one-half said selected impedance, said fifth transmission line arrangement transforms said impedance at said first node point to twice said selected impedance at said sum node, and said sixth transmission line arrangement transforms said impedance at said second node point to twice said selected impedance at said sum node, and the net impedance at said sum node is equal to said selected impedance, and whereby in said first mode of operation at least said first amplified signal is applied to said sum node in a reduced power mode, said first switch means short-circuits said second transmission line arrangement an odd multiple of one-quarter wavelength from said first node point and thereby presents an open circuit to said first node point, and whereby said fifth transmission line arrangement presents to said sum node an impedance equal to said selected impedance.

2. An amplifier according to claim 1 wherein said second location is at said second node point, whereby in said first mode of operation the low impedance produced by said second switch means at said second node point is transformed by said sixth transmission line arrangement to a high impedance which does not affect said impedance equal to said selected impedance which is presented by said fifth transmission line arrangement to said sum node, and whereby said net impedance at said sum node equals said selected impedance, and whereby the power applied to said sum node is reduced from said full power by a factor of four.

3. An amplifier according to claim 2 wherein the electrical lengths of said first, second, third, and fourth transmission line arrangements are equal.

4. An amplifier according to claim 2 wherein the electrical lengths of said first, second, third, and fourth transmission line arrangements differ only by integer multiples of one wavelength at said frequency.

5. An amplifier according to claim 2 further comprising:

fifth and sixth amplifier means, each coupled to said power splitting means for receiving one of said equal portions of signal for producing fifth and sixth amplified signals at fifth and sixth output ports, respectively;

a seventh transmission line arrangement having said selected characteristic impedance, said seventh transmission line arrangement being coupled between said fifth output port and said first node point for coupling said fifth amplified signal from said seventh output port to said first node point;

an eighth transmission line arrangement having said selected characteristic impedance, said eighth transmission line arrangement being coupled between said sixth output port and said second node point for coupling said sixth amplified signal from said sixth output port to said second node point;

and wherein said controllable switch means further comprises (a) third switch means coupled to said first transmission line arrangement for controllably short-circuiting said first transmission line arrangement at a third location an odd integer multiple of one-quarter wavelength at said frequency from said first node point, (b) fourth switch means coupled to said fourth transmission line arrangement for controllably short-circuiting said fourth transmission line arrangement at a fourth location an odd integer multiple of one-quarter wavelength at said frequency from said second node point, (c) fifth switch means coupled to said seventh transmission line arrangement for controllably short-circuiting said seventh transmission line arrangement at a fifth location an odd integer multiple of one-quarter wavelength at said frequency from said first node point, and (d) sixth switch means coupled to said eighth transmission line arrangement for controllably short-circuiting said eighth transmission line arrangement at a sixth location an odd integer multiple of one-quarter wavelength at said frequency from said second node point;

and wherein said control means during normal operation in either said first or second modes of operation maintains said fifth and sixth switch means conductive for short-circuiting said seventh and eighth transmission-line arrangements, whereby said seventh transmission line arrangement presents an open-circuit to said first node point and said eighth transmission line arrangement presents an open circuit to said second node point, and said fifth and sixth amplifiers are effectively redundant;

and wherein said control means in the event of a failure of one of said first and second amplifiers renders said fifth switch means nonconductive and also renders one of said first and second switch means conductive, thereby substituting a redundant amplifier means for a failed amplifier means;

and wherein said control means in the event of a failure of one of said third and fourth amplifier means renders said sixth switch means nonconductive and also renders one of said third and fourth switch means conductive, thereby substituting a redundant amplifier means for a failed amplifier means.

6. An amplifier according to claim 1 wherein said second location is one-quarter wavelength at said frequency from said second node point, whereby in said first mode of operation the low impedance produced by said second switch means is transformed by said third transmission line arrangement to a high impedance at said second node point, and whereby said fifth and sixth transmission line arrangements each present said selected impedance to said sum node, and the effective impedance at said sum node equals one-half of said selected impedance.

7. An amplifier according to claim 6 further comprising:
   seventh and eighth transmission line means, each being shorted at a first end and each also including a second end;
   ninth transmission line means coupled to said sum node, said ninth transmission line means having said selected characteristic impedance;
   third switch means serially coupled between said second end of said seventh transmission line means and said sum node;
   fourth switch means serially coupled between said second end of said eighth transmission line means and a point at a second location on said ninth transmission line means;
   and wherein;
   said second location is said one-quarter wavelength at said frequency from said second node point, whereby when said first and second switch means are conductive said first and fourth amplifier means couple signal to said sum node, but a mismatch occurs at said sum node; and
   said control means is further coupled to said third and fourth switch means for rendering said third and fourth switch means conductive during these intervals in which said first and second switch means are rendered conductive, whereby said point on said ninth transmission line means may be utilized as a matched output port.

8. An amplifier according to claim 7 wherein:
   said seventh transmission line arrangement has said selected characteristic impedance and an electrical length of approximately 0.735 wavelengths at said frequency for presenting to said sum node a reactive impedance equal in magnitude to one-half said selected impedance; and
   said eighth transmission line arrangement has said selected characteristic impedance and an electrical length of approximately $\lambda/8$ at said frequency for presenting to said point on said ninth transmission line means a reactive impedance equal to said selected impedance.

9. An amplifier according to claim 6 further comprising:
   seventh, eighth, and ninth transmission line arrangements, each being open-circuited at a first end and each also including a second end; and wherein
   said second location is said one-quarter wavelength at said frequency from said second node point, whereby when said first and second switch means are conductive said first and fourth amplifier means couple signal to said sum node, but a mismatch occurs at said sum node;
   said controllable switch means further comprises third, fourth and fifth switch means, said third switch means being serially coupled between said first node point and said second end of said seventh transmission line arrangement for coupling a capacitive impedance to said first node point, which is transformed by said fifth transmission line arrangement into an inductive impedance at said sum node, said fourth switch means being serially coupled between said second node point and said second end of said eighth transmission line arrangement for coupling a capacitive impedance to said second node point which is transformed by said sixth transmission line arrangement into an inductive impedance at said sum node, said fifth switch means being serially coupled between said sum node and said second end of said ninth transmission line arrangement for coupling a capacitive impedance to said sum node; and
   said control means is further coupled to said third, fourth, and fifth switch means for rendering said third, fourth, and fifth switch means conductive during those intervals in which said first and second switch means are rendered conductive, whereby said sum node is substantially matched to said selected impedance.

10. An amplifier according to claim 1 wherein said odd integer is one, and said odd integer multiple of one quarter wavelength is one quarter wavelength.

11. A power reducible composite signal source, comprising:
    first, second, third and fourth source means, each producing signal samples to be summed at an output port;
    first, second, third, and fourth transmission lines, each having a characteristic impedance equal to a selected impedance of $Z_0$, each of said first, second, third, and fourth transmission lines being coupled at one end to an output port of said first, second, third, and fourth source means, respectively, said first and second transmission lines being coupled together at their other ends to form a first node, said third and fourth transmission lines being coupled together at their other ends to form a second node;
    fifth and sixth transmission lines, each having said selected characteristic impedance $Z_0$ and an electrical length of $\lambda/4$ at a frequency, said fifth transmission line being coupled at one end to said first node and at a second end to an output port, said sixth transmission line being coupled at one end to said second node and at a second end to said output port, whereby output signals from said first, second, third, and fourth source means is summed at said output port, and said output port has said selected impedance;
    controllable switch means coupled for short-circuiting said second transmission line at a point $\lambda/4$ at said frequency from said first node, and for short-circuiting said third transmission line at a location $N\lambda/4$ from said second node, when N is an odd integer which may include zero; and
    control means coupled to said controllable switch means for selectively operating said controllable switch means between nonconductive and conductive conditions, whereby in said nonconductive condition said second and third transmission lines are not short-circuited and said output signal from said first, second, third and fourth source means continue to be summed at said output port, and whereby in said conductive condition, signal from at least said second and third source means does not reach said output port and the output signal level is correspondingly reduced.

12. Signal source according to claim 11, wherein the lengths of said first, second, third, and fourth transmission lines are equal.

13. A signal source according to claim 11, wherein N equals zero, whereby said controllable switch means short-circuits said third transmission line at said second node, signal from said fourth source means does not reach said output port, said reduction in output signal level is 6 dB, and the impedance at said output port is equal to said selected impedance $Z_0$.

14. A signal source accordind to claim 11, wherein N equals one, whereby said controllable switch means short-circuit said third transmission line $\lambda/4$ from said second mode, said reduction in signal level is 3 dB, and the impedance at said output port is one half said selected impedance $Z_0$.

15. A signal source according to claim 14, further comprising matching means coupled to said output port.

16. A signal source according to claim 11, wherein each of said first, second, third and fourth source means comprise amplifiers driven from a common signal source.

* * * * *